United States Patent [19]

Sun

[11] 4,137,099
[45] Jan. 30, 1979

[54] METHOD OF CONTROLLING LEAKAGE CURRENTS AND REVERSE RECOVERY TIME OF RECTIFIERS BY HOT ELECTRON IRRADIATION AND POST-ANNEALING TREATMENTS

[75] Inventor: Yen S. E. Sun, Los Altos, Calif.

[73] Assignee: General Electric Company, Auburn, N.Y.

[21] Appl. No.: 814,405

[22] Filed: Jul. 11, 1977

[51] Int. Cl.$^2$ .......................................... H01L 21/263
[52] U.S. Cl. .................................... 148/1.5; 148/187; 250/492 A; 357/29; 357/91
[58] Field of Search ............... 250/492 A; 357/29, 91; 148/1.5, 187

[56] References Cited

U.S. PATENT DOCUMENTS

| | | | |
|---|---|---|---|
| 3,888,701 | 6/1975 | Tarneja et al. | 148/1.5 |
| 3,894,890 | 7/1975 | Bauerlein et al. | 148/1.5 |
| 3,933,527 | 1/1976 | Tarneja et al. | 148/1.5 |
| 4,043,836 | 8/1977 | Sun | 148/1.5 |
| 4,047,976 | 9/1977 | Bledsoe et al. | 148/1.5 |
| 4,056,408 | 11/1977 | Bartko et al. | 148/1.5 |

OTHER PUBLICATIONS

P. Rai-Choudhury et al., "Electron Irradiation . . . in Carrier Life-Time Control", IEEE, vol. ED-23, (1976) Aug. 814.
Bemski et al., "Annealing of Electron Bombardment Damage in Si Crystals," Phys. Rev. 108 (1957) 645.

*Primary Examiner*—L. Dewayne Rutledge
*Assistant Examiner*—Upendra Roy
*Attorney, Agent, or Firm*—R. J. Mooney; S. B. Salai

[57] ABSTRACT

High speed semiconductor rectifiers are fabricated by providing a rectifier, increasing the temperature thereof to a relatively high value, irradiating the rectifier with high energy lattice-damage causing particles while maintaining the relatively high temperature, and annealing the irradiated rectifier at a temperature and for a time sufficient to decrease the leakage current of the rectifier to a low value without substantially increasing the reverse recovery time of the rectifier.

14 Claims, 5 Drawing Figures

METHOD OF CONTROLLING LEAKAGE CURRENTS AND REVERSE RECOVERY TIME OF RECTIFIERS BY HOT ELECTRON IRRADIATION AND POST-ANNEALING TREATMENTS

This invention relates in general to semiconductor rectifiers and more particularly to high speed semiconductor rectifiers and method for the manufacture thereof.

It is well known to improve the characteristics of certain types of semiconductor devices by the irradiation thereof with relatively high energy particles. For example, see the early work of Miller, U.S. Pat. No. 2,868,988 wherein the irradiation of rectifiers to reduce transient reverse current is discussed. It was observed therein that bombarding a rectifier with high energy (2 MeV) electrons shortened the lifetime of charge carriers within the device and therefore increased the maximum useable frequency of the rectifier. The irradiation of rectifiers with a subsequent annealing step is described, for example, by Logan in U.S. Pat. No. 3,174,882 wherein tunnel diodes are fabricated which are characterized by two discrete, negative resistance, operating regions.

It has been recognized, for example, by Tarneja et al., U.S. Pat. No. 3,809,582, that the irradiation of rectifiers for reducing the reverse recovery time thereof also increases the forward voltage drop of the rectifiers. It has been felt that the reduction in reverse recovery time which is achieved is sufficient to compensate for the increase in forward voltage which is characterized, therefore, as tolerable. Tarneja has also described in U.S. Pat. No. 3,933,527 a method for tailoring the characteristics of rectifiers after fabrication by irradiation according to a formula set forth therein. In a still further patent, U.S. Pat. No. 3,888,701, Tarneja et al. described the irradiation of semiconductor rectifiers followed by annealing at a relatively high temperature between 250° C. and 350° C. The annealing is recognized to accomplish a decrease in the forward voltage drop and an increase in the reverse recovery time.

U.S. patent application Ser. No. 682,581 now U.S. Pat. No. 4,043,836 filed by the same inventor as the instant application and of common assignee herewith is concerned with the irradiation of semiconductor devices at an elevated temperature. As was described in that application, high temperature irradiation allows the elimination of a long and therefore potentially costly annealing step following irradiation as had been theretofore required.

While the foregoing illustrates a generally increasing understanding of the mechanisms involved in the irradiation of semiconductor rectifiers and the improvements in characteristics which may be obtained thereby, there seems to have been little or no teaching of the optimization of the various methods and combinations of methods for improving the characteristics of semiconductor rectifiers by irradiation, annealing, and the like.

Accordingly, it is an object of this invention to provide a method for the manufacture of high speed semiconductor rectifiers which provides the optimum compromise among reverse recovery time, forward voltage drop and leakage current.

It is another object of this invention to provide a method for improving the characteristics of previously fabricated rectifiers in order to achieve the optimum compromise among reverse recovery time, forward voltage drop, and leakage current.

Briefly stated and in accordance with one aspect of this invention, a method for making high speed semiconductor rectifiers having improved operating characteristics includes the steps of fabricating the rectifier by any of those methods well known to those skilled in the art for fabricating high speed rectifiers and subsequently irradiating the rectifiers while maintaining their temperatures at about 300° C. followed by annealing rectifiers at a temperature of between about 290° and 310° C. It has been discovered that while the rates of change of forward voltage drop and of reverse recovery time are essentially constant during annealing, the rate of change of leakage current decreases with annealing time. It has further been found that in accordance with a particular example which will be more fully described hereinbelow, the leakage current is reduced to less than 50% of its unannealled value after only three hours of annealing. By comparing the rates of change of reverse recovery time and leakage current during annealing, it has been discovered that the rate of change of reverse recovery time is less than the rate of change of leakage current during the first three hours of annealing while the rate of change of reverse recovery time becomes greater than the rate of change of leakage current after ten hours of annealing. Therefore, in accordance with this invention, a range of annealing times has been discovered which produces the optimum device characteristics. This range of annealing times is between three hours and ten hours and more preferably between three hours and six hours depending upon the temperature of annealing.

In accordance with another aspect of this invention, semiconductor rectifiers are irradiated with electrons having energies between about 0.4 and 12 MeV for dosages between about $10^{13}$ e/cm$^2$ and $10^{16}$ e/cm$^2$.

In accordance with yet another aspect of this invention, the characteristics of high speed semiconductor rectifiers are improved by heating the rectifier to a temperature of between about 100° and 500° C., irradiating said rectifier, while heated, with high energy electrons in the range of 0.4 to 12 MeV, and then annealing the rectifier at a temperature of between about 290° C. and 310° C. for a time between about three hours and ten hours.

The features of the invention which are believed to be novel are pointed out with particularity in the appended claims. The invention itself however, both as to its organization and method of operation together with further objects and advantages thereof may best be understood by reference to the following description taken in conjunction with the accompanying drawings in which:

Figure 1:
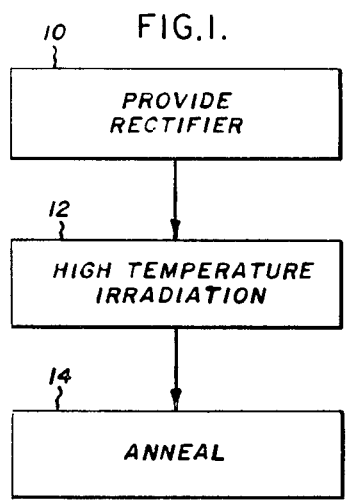
FIG. 1 is a flow chart diagram of a method for making a high speed semiconductor rectifier in accordance with this invention.

Referring now to FIG. 1, a process for providing a rectifier having optimized reverse recovery time, forward voltage drop and leakage current is illustrated in block-diagram flow chart form. In accordance with a first step 10, a rectifier is provided which is preferably a high voltage, relatively high current rectifier as, for example, a rectifier having a reverse breakdown voltage on the order of 1800 volts and a forward current carrying capacity on the order of 400 amps. While a particular type of rectifier will be described in conjunction with the explanation of an exemplary embodiment of this invention, it will be understood by those skilled in the art that the principles taught herein and the invention which is described are equally applicable to a wide range of rectifier types and are not, therefore, limited to those particular embodiments described. An exemplary rectifier of a type to which this invention is suitable for application is one having a P+NN+ structure, the rectifier being fabricated in an N conductivity type semiconductor wafer of a thickness, for example, of 11 or 12 mils and a resistivity of 60 to 90 ohm centimeters. Typically, semiconductor layers are formed on opposite surfaces of a wafer of the type described by diffusion of impurity atoms into said surfaces. For example, a P+ conductivity type region might advantageously be formed by the diffusion of gallium to a surface concentration of $5 \times 10^{18}$ atoms per centimeter cube, and a thickness of about 3 mils. Similarly, an N+ conductivity type layer of a thickness of approximately 2 mils might readily be formed by the diffusion of phosphorus to a concentration of between $5 \times 10^{18}$ and $1 \times 10^{20}$ atoms per centimeter cubed, concentrations on the order of $10^{19}$ being preferred. After diffusion, electrodes are conveniently formed by the deposition of metal on said surfaces, aluminum being typically employed. It will be understood by those skilled in the art that a semiconductor rectifier of the type described is more or less conventional and as such forms no part of the instant invention except insofar as here it illustrates an exemplary rectifier of the type to which the teachings of this invention might advantageously be directed.

After metallization, a rectifier of the type described is, according to the present invention, elevated to a high temperature in excess of approximately 150° C. and then subjected, without substantial cooling, to a high temperature irradiation step 12. In accordance with a presently preferred embodiment of this invention, irradiation is performed at a temperature in excess of 150° C. and less than 500° C., and more preferably in the range of 250° to 350° C. Irradiation is performed with electrons having energies in the range of 0.4 to 12 MeV. Irradiation is performed for a time sufficient to achieve a dosage of between $5 \times 10^{13}$ and $5 \times 10^{15}$ electrons per $cm^2$ and more preferably in the range of $10^{14}$ to $10^{15}$ electrons per $cm^2$. As will be appreciated by one skilled in the art, the time of irradiation necessary to achieve the foregoing densities depends upon the magnitude of the electron flux. Typically, times of irradiation on the order of between about 20 seconds and 120 seconds at a flux level of about $5 \times 10^{12}$ e/$cm^2$/second are expected to provide satisfactory results.

After high temperature irradiation step 12, the rectifier is annealed at a temperature in the range of 280° to 350° C. and more preferably between 290° and 310° C. for a time between 2 hours and 10 hours and more preferably between 3 hours and 6 hours.

The precise duration and conditions of the foregoing steps may vary somewhat from the preferred values set forth and may be readily determined by one skilled in the art and in accordance with the principles heretofollow.

Figure 2:
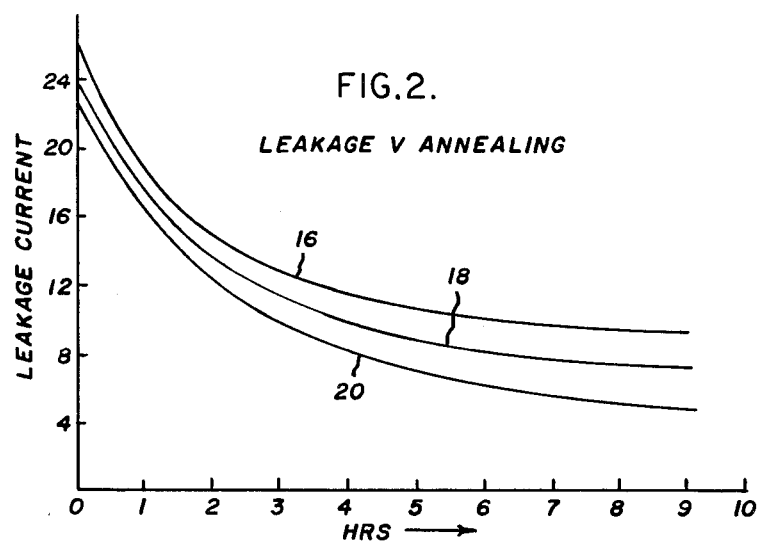
FIG. 2 is a graphical representation of the relation between leakage current and annealing time for a semiconductor rectifier irradiated in accordance with this invention.

Referring to FIG. 2, the relation between leakage current and annealing time is illustrated in graphical form. Curves 16, 18, and 20 represent devices irradiated in accordance with the foregoing procedure for 50, 40, and 30 seconds, respectively, at 1.5 MeV, corresponding to dosages $2.3 \times 10^{14}$, $1.9 \times 10^{14}$, and $1.4 \times 10^{14}$ e/$cm^2$, respectively. The leakages illustrated are in milliamps at 175° C. and an applied potential of 1800 volts for a device of the type hereinabove described. It will be appreciated by reference to FIG. 2 that while the leakage current continues to decrease with increasing annealing time, the rate of change of leakage current with respect to time decreases with increasing time and, in fact, the percentage of reduction of leakage current is greater than 50 after three hours of annealing. After approximately ten hours, the rate of change of leakage current with time approaches nearly zero and essentially no further advantage may be expected to be obtained.

Figure 3:
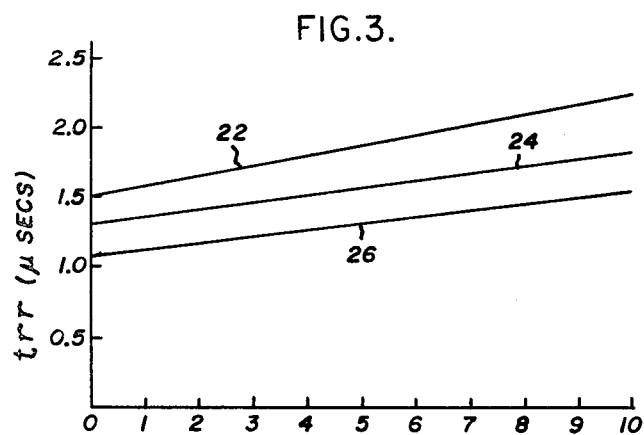
FIG. 3 is a graphical representation of the relation between the reverse recovery time and annealing time for a semiconductor rectifier irradiated in accordance with this invention.

By contrast, between reverse recovery time, $t_{rr}$, and annealing time is illustrated graphically in FIG. 3. Again, curves are illustrated for devices which have been irradiated for varying times at an elevated temperature. Curve 22 represents devices which have been irradiated for 35 seconds, curve 24 — 40 seconds, and curve 26 — 50 seconds at a dosage rate of $4.67 \times 10^{12}$ e/$cm^2$ sec. Comparison of FIGS. 2 and 3 readily reveals that while leakage current decreases at a decreasing rate with annealing time, reverse recovery time increases at a substantially constant rate with increasing annealing time. Accordingly, and as has been described, the best compromise between leakage currrent and reverse recovery time, that is to say, the lowest leakage current consistent with a short reverse recovery time, is achieved by annealing for less than ten hours. It will be recalled that the rate of decrease in leakage current as a function of time decreases to essentially zero after ten hours of annealing. To the extent that leakage current remains therefore essentially the same while reverse recovery time continues to increase, it will be appreciated that further annealing is undesirable.

Figure 4:
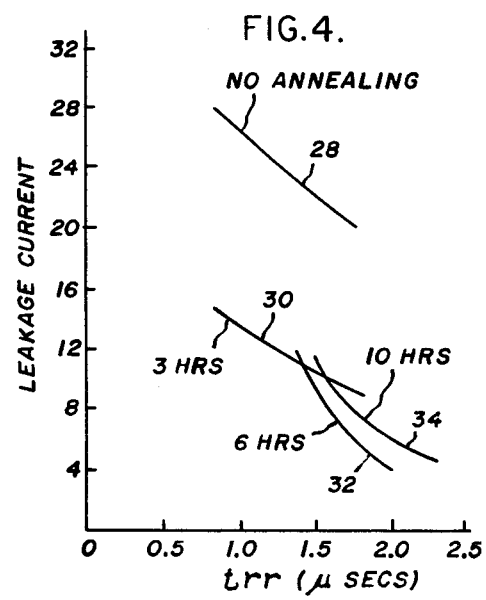
FIG. 4 is a graphical representation of the relation between leakage current and reverse recovery time with annealing time as a parameter for a semiconductor rectifier irradiated in accordance with this invention.

FIG. 4 illustrates the trade-off between leakage current and reverse recovery time as a function of dosage for semiconductor rectifiers processed in accordance with this invention, including as an additional parameter the time of annealing after high temperature irradiation. Curves 28, 30, 32, and 34 illustrate the relation between leakage and reverse recovery time for semiconductor rectifiers having annealing times of 0, 3, 6, and 10 hours, respectively. Those skilled in the art will readily appreciate that the most desirable curve is that curve lying closest to the origin of the axes of FIG. 4. It will be seen by reference to FIG. 4 that curve 32 provides the greatest degree of improvement in ultimate device characteristics over curve 28 which describes a non-annealed device. Both curves 30 and 34 describe devices wherein the improvement in the compromise between leakage current and reverse recovery time is less than that described by curve 32. Curve 30 describes a compromise which results from an annealing time which is shorter than optimum while curve 34 describes the characteristics of a device annealed for a time longer than optimum. It will be appreciated, however, that each of curves 30, 32, and 34 describes characteristics which are an improvement over the non-annealed characteristics described by curve 28.

It will be understood by those skilled in the art that while FIG. 4 represents the presently preferred irradiation and annealing conditions for a device as hereabove described, where devices are desired to be optimized which differ somewhat from the device described herein, somewhat different conditions may provide the optimum compromise among leakage, reverse recovery time, and forward voltage drop. Accordingly, it is intended that the scope of the present invention include not only those particular conditions herein described, but also those conditions which vary somewhat therefrom but which are, nevertheless, within the true spirit and scope of the invention as defined by the appended claims.

Figure 5:
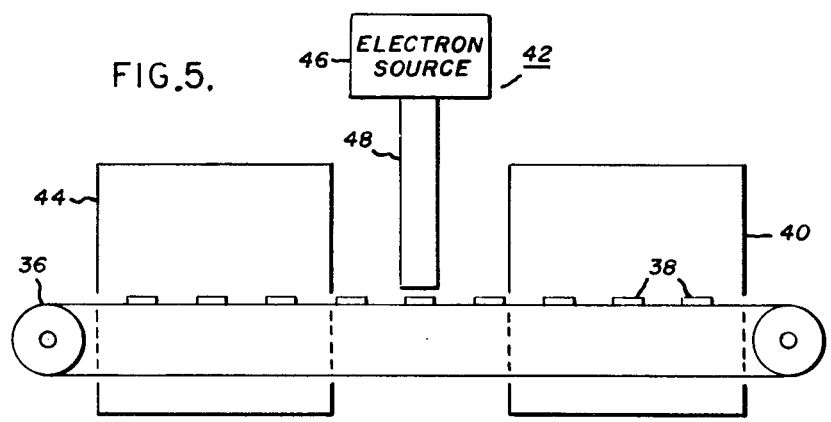
FIG. 5 illustrates apparatus suitable for performing the processes in accordance with this invention.

FIG. 5 illustrates diagrammatically an arrangement of apparatus for the high temperature irradiation and annealing of semiconductor devices in accordance with this invention. A conveyor belt 36 of conventional type is utilized to sequentially pass semiconductor devices 38 through 40 beneath irradiation means 42 and through furnace means 44. While FIG. 5 illustrates apparatus utilizing a conveyor belt, it will be appreciated by those skilled in the art that other methods for exposing the semiconductor devices to the appropriate conditioning environments may be employed as, for example, by merely moving the devices physically from a kiln to an irradiation site and then returning them to the same or another kiln or oven to sequentially perform the heating, irradiation, and annealing steps in accordance with this invention. The apparatus of FIG. 5 is preferably constructed so that pellets 38 remain in oven 40 for a time sufficient to increase their temperature to about 300° C. They are then moved under the irradiation source 42 without being allowed to cool significantly so that irradiation is performed while the temperature of the devices is substantially at about 300° C. Where desired, irradiation source 42 may be incorporated within oven 40 to insure that irradiation occurs at a high temperature. The irradiation source 42 may be any type of irradiation source known to those skilled in the art such as, for example, an electron accelerator or other high energy electron producing device which provides electrons having an energy in excess of 0.4 MeV. In accordance with one embodiment of this invention, an electron source 46 is provided along with an evacuated tube 48 which is maintained at a pressure on the order of $10^{-6}$ torr and which is sealed at the end remote from the electron source by a thin titanium window. Devices 38 are irradiated, in accordance with this invention, to a dosage of between $10^{13}$ and $5 \times 10^{16}$ e/cm$^2$, and more preferably to a dosage between $10^{14}$ and $10^{15}$ e/cm$^2$. The time of irradiation depends upon the flux of the electron stream.

After irradiation, devices 38 are moved by conveyor 36 to annealing oven 44 where they are heated to a temperature of between about 280° and 350° C. and more preferably to a temperature of between about 290° and 350° C. for between three and ten hours and more preferably three and six hours. While conveyor 36 is illustrated as a single belt, it may be desirable in accordance with this invention to provide two or more distinct conveyor structures along with means for transferring pellets 38 therebetween in order to accomplish the heating, irradiation, and annealing steps in accordance with this invention. For example, those skilled in the art will appreciate that the heat which occurs in oven 40 and the irradiation by irradiation source 42 may be accomplished relatively quickly and therefor that a single conveyor may be employed. Annealing within oven 44 is carried out for a time relatively long compared with heating and irradiation and, therefore, a separate slower moving conveyor may advantageously be employed. After annealing and cooling, the devices are complete insofar as this invention is concerned and may be packaged in accordance with their ultimate purpose. While the apparatus of FIG. 5 represents an apparatus which is suited to practicing this invention, it will be understood that modifications and changes may be made therein while still remaining within the true spirit and scope of this invention. For example, a thin enclosure may be provided for surrounding the semiconductor devices during the irradiation portions of the process in accordance with this invention. Typically, one or two mil aluminum may provide improved heat retention during the annealing step without the necessity for either positioning the irradiation device 42 within oven 40 or for substantially increasing the energy thereof due to absorption by the enclosure. Similarly, a hot plate or the like may be provided at the irradiation site for heating the devices to or maintaining them at the desired temperature for irradiation.

While this invention has been described utilizing electron irradiation as the preferred method for reducing the lifetime of high speed rectifiers in order to achieve the advantages hereof, it will be understood by those skilled in the art that other forms of lattice-damage causing irradiation may advantageously be employed where desired with attendant modification of the times and dosages employed. For example, gamma or neutron irradiation may be employed; Gamma irradiation being preferred insofar as the dosage may be accurately controlled and irradiation may be performed relatively inexpensively. Proton irradiation although utilizable in theory is not to be preferred insofar as the penetration is much greater than that obtained with the foregoing types.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:
1. A method for making a high speed semiconductor rectifier characterized by low leakage current and short reverse recovery time comprising the steps of:
   fabricating a rectifier;
   heating said rectifier to a temperature of about 300° C.;
   irradiating said rectifier while maintaining the temperature of said rectifier at about 300° C.; and then
   annealing said rectifier at a temperature of between about 280° and 350° C. for a time between about two and about ten hours selected to decrease the leakage current while at the same time increasing the reverse recovery time by a relatively lesser amount.
2. The method of claim 1 wherein said irradiation step comprises irradiating said rectifier with electrons having energies between about 0.4 and 12 MeV.

3. The method of claim 1 wherein said annealing step comprises annealing said rectifier for between about three and six hours.

4. The method of claim 2 wherein said irradiation step comprises irradiation for between about 20 and 60 seconds at a flux rate of about $5 \times 10^{12}$ e/cm² sec.

5. The method of claim 2 wherein said irradiation step comprises irradiation to a concentration of between $10^{13}$ and $10^{16}$ e/cm².

6. The method of claim 4 wherein said annealing step comprises annealing said rectifier for between about three and six hours.

7. The method of claim 3 wherein said annealing step comprises annealing at a temperature of about 310° C.

8. The method of claim 6 wherein said annealing step comprises annealing at a temperature of about 310° C.

9. A method for improving the operating characteristics of a high speed semiconductor rectifier comprising:
providing a rectifier;
heating said rectifier to a temperature of between about 250 and 350° C.;
irradiating said rectifier while maintaining said temperature between about 250 and 350° C.;
annealing said rectifier at a temperature between 290 and 310° C. for a time between about two and about ten hours selected to decrease the leakage current while at the same time increasing the reverse recovery time by a relatively lesser amount.

10. The method of claim 9 wherein said irradiating step comprises irradiating said rectifier with electrons at an energy of between about 0.4 and 12 MeV.

11. The method of claim 10 wherein said irradiating comprises irradiating said rectifier for between about 30 and 50 seconds at a flux rate of about $4.7 \times 10^{12}$ e/cm² sec.

12. The method of claim 10 wherein irradiating said rectifiers comprises irradiating said rectifier to a concentration of between about $10^{14}$ and $10^{15}$ e/cm².

13. The method of claim 12 wherein said annealing comprises annealing for between about 3 and 6 hours.

14. The method of claim 13 wherein said annealing comprises annealing at a temperature of about 310° C.

* * * * *